United States Patent [19]
Matsubara

[11] Patent Number: 5,963,829
[45] Date of Patent: *Oct. 5, 1999

[54] METHOD OF FORMING SILICIDE FILM

[75] Inventor: Yoshihisa Matsubara, Tokyo, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/617,647

[22] Filed: Mar. 15, 1996

[30] Foreign Application Priority Data

Mar. 15, 1995 [JP] Japan .................................. 7-055469

[51] Int. Cl.⁶ ...................... H01L 21/4763; H01L 21/44
[52] U.S. Cl. ......................... 438/649; 438/655; 438/683
[58] Field of Search ..................................... 438/649, 655, 438/664, 683

[56] References Cited

U.S. PATENT DOCUMENTS

| | | | |
|---|---|---|---|
| 4,545,116 | 10/1985 | Lau | 29/591 |
| 4,822,753 | 4/1989 | Pintchovski et al. | 437/192 |
| 4,855,798 | 8/1989 | Imamura et al. | 357/71 |
| 5,236,868 | 8/1993 | Nulman | 438/655 |
| 5,449,631 | 9/1995 | Giewont et al. | 437/200 |
| 5,646,070 | 7/1997 | Chung | 437/200 |
| 5,665,646 | 9/1997 | Kitano | 438/592 |
| 5,721,175 | 2/1998 | Kunishima et al. | 438/542 |

OTHER PUBLICATIONS

Mallardeau et al, "Characterization of TiSi2 Ohmic and Schottky Contacts Formed by Rapid Thermal Annealing Technology", J. Electrochem. Soc., vol. 136, No. 1, pp. 238–241, Jan. 1989.

*Primary Examiner*—Brian Dutton
*Attorney, Agent, or Firm*—Foley & Lardner

[57] ABSTRACT

A method of forming a silicide film composed of refractory metal in a certain region of a semiconductor device to be formed on a semiconductor substrate, includes the steps of (a) depositing a thin film composed of refractory metal on both a semiconductor substrate and a semiconductor device, (b) carrying out a first thermal annealing to the semiconductor substrate, semiconductor device, and refractory metal in depressurized or diluted gas atmosphere including nitrogen therein, and (c) carrying out a second thermal annealing to the semiconductor substrate, semiconductor device and refractory metal in argon gas atmosphere or high vacuum atmosphere. It is preferable that the second thermal annealing be carried out at higher temperature than the first thermal annealing. The method makes it possible to reduce a resistance of the silicide layer, and selectively form the silicide layer only on a gate electrode and a diffusion layer. In addition, the method completely avoids leak current from flowing between a gate electrode and source/drain regions of a MOS transistor.

21 Claims, 10 Drawing Sheets

METHOD OF FORMING SILICIDE FILM

BACKGROUND OF THE INVENTION

1. Field of the Invention

The invention generally relates to a method of fabricating a semiconductor, and more particularly to a method of forming a silicide film composed of refractory metal in self-aligning fashion on a diffusion layer and a gate electrode in a MOS transistor.

2. Description of the Related Art

With demand for a micro-sized and/or highly densified semiconductor device, there has been research and development a ultra-large scale integrated semiconductor device such as a memory device and a logic device has been in accordance with 0.15–0.25 μm design rule. Such ultra-large integration of a semiconductor device requires a reduced width of a gate electrode and a diffusion layer, and a reduced thickness of various layers constituting a semiconductor device.

However, a reduced width of a gate electrode or wirings associated with a gate electrode and a reduced thickness of layers constituting a gate electrode inevitably brings increased wiring resistance, which causes delayed operation in a circuit. Thus, it is quite important in a micro-sized semiconductor device to make a silicide layer composed of refractory metal, which constitutes a part of a gate electrode, have decreased resistance. In particular, technology for forming salicide (self-aligned-silicide) in which titanium is used as refractory metal is indispensable for fabricating a micro-sized insulative gate field effect transistor (hereinafter, referred to simply as "MOS transistor").

With the demand for ultra-large scale integration of a semiconductor device, it is necessary in the MOS transistor to restrict diffusion of impurities in a diffusion layer to thereby depress the short channel effect. As a result, a junction depth in a diffusion layer is made shallower. However, if a surface of the diffusion layer comes in contact with a silicide region, leak current caused by crystal defects is increased with the result of inoperability of switching operation of the MOS transistor. Accordingly, as the junction depth is made shallower in the diffusion layer, it is absolutely necessary for the silicide layer to have a decreased thickness.

Hereinbelow is explained a conventional method of fabricating a MOS transistor having a salicide configuration with reference to FIGS. 1A to 1E, which are cross-sectional views of a transistor, showing respective step of the method.

Figure 1A:
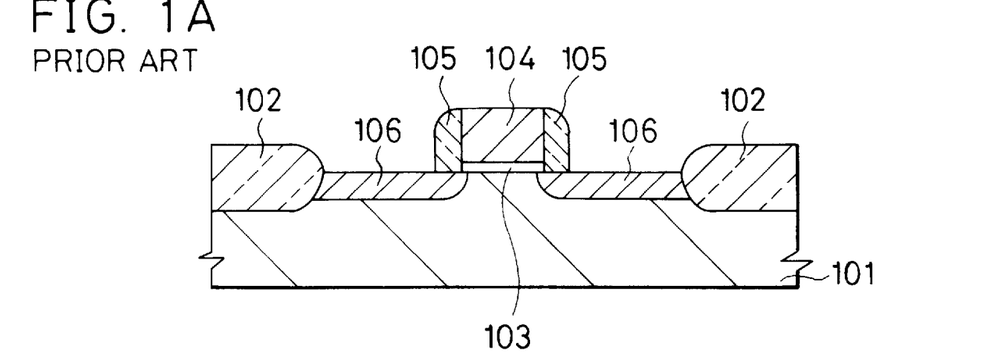
FIGS. 1A to 1E are cross-sectional views showing respective step of a conventional method.

First, as illustrated in FIG. 1A, a plurality of device isolation insulative films 102 are formed by LOCOS in certain regions on a silicon substrate 101. Then, impurities acting as a channel stopper are ion-implanted, and then a gate insulative film 103 is deposited by thermal oxidation.

Then, a polysilicon film having a thickness of about 150 nm is deposited by CVD over a resultant. Then, impurities such as phosphorus are doped. Then, the polysilicon film is patterned by photolithography and dry-etching into a desired pattern to thereby form a gate electrode 104. Then, a silicon dioxide film is deposited by CVD over a resultant. Subsequently, anisotropic dry etching is carried out, thereby forming a spacer 105 at a sidewall of the gate electrode 104.

Then, impurities such as arsenic (As) and boron (B) are ion-implanted, and subsequently, a resultant is thermally annealed at temperature in the range of 800° C. to 1000° C. to thereby form a diffusion layer 106. If an n-channel MOS transistor is to be fabricated, the diffusion layer including arsenic is formed, whereas if a p-channel MOS transistor is to be fabricated, the diffusion layer including boron is formed. The thus formed diffusion layer 106 acts as a source/drain region.

Figure 1B:
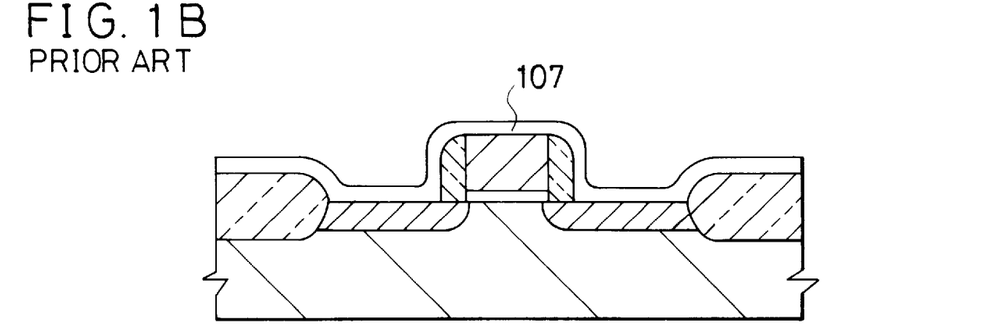

Then, as illustrated in FIG. 1B, a titanium film 107 having a thickness of about 50 nm is deposited over a resultant by sputtering. Then, a resultant is thermally annealed for 30–60 seconds in $N_2$ atmosphere under atmospheric pressure. In this thermal annealing, a lamp annealing apparatus is used, and process temperature is set in the range of 600° C. to 650° C. Thus, the titanium layer 107 is silicided.

Figure 1C:
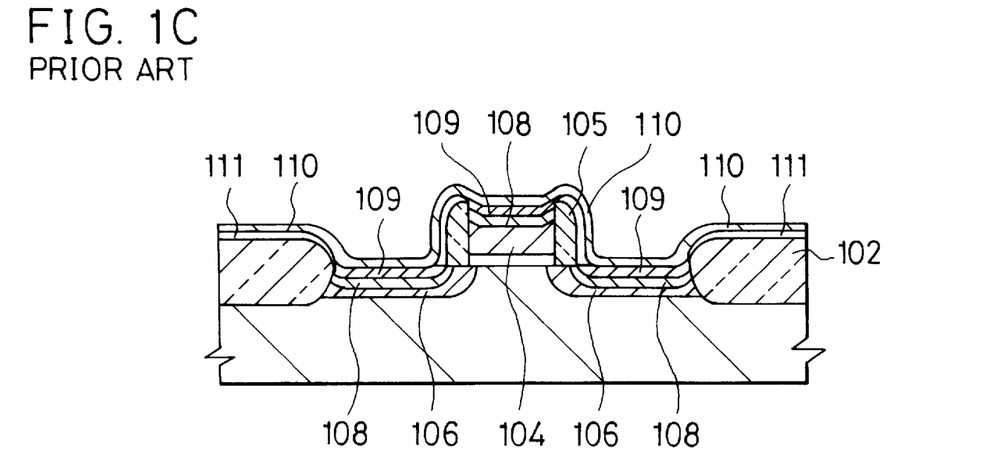

As illustrated in FIG. 1C, on an exposed surface of the gate electrode 104 and also on the diffusion layer 106 are formed a C49-structure silicide layer 108 having a crystal structure and high resistivity, a first nitrogen containing silicide layer or a C49-structure silicide layer 109 containing nitrogen atoms therein, and a nitrided titanium nitride layer 110 in this order. On the other hand, on the device isolation insulative films 102 and the spacer 105 both composed of a silicon dioxide film are formed the titanium nitride layer 110 and a unreacted titanium layer 111.

Figure 1D:
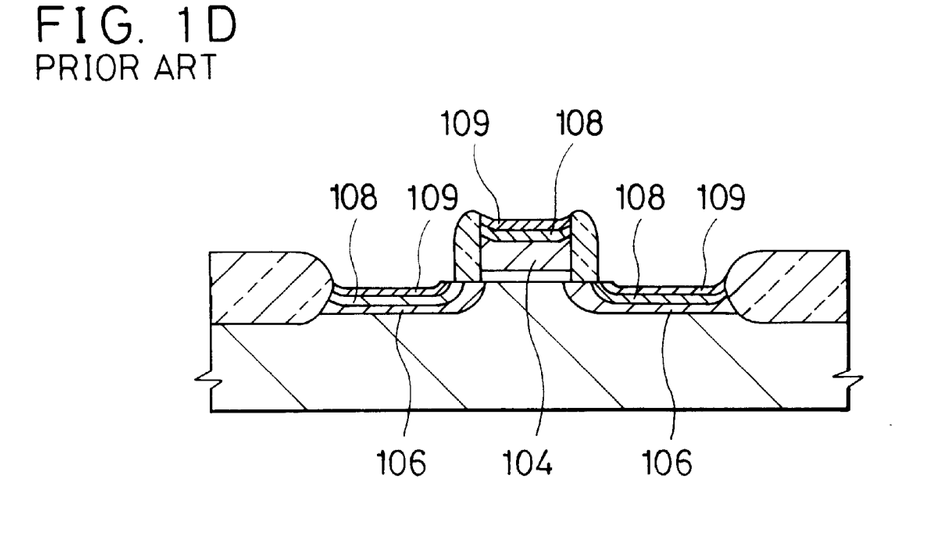

Then, as illustrated in FIG. 1D, the unreacted titanium layer 111 and the titanium nitride layer 110 are removed by means of mixture solution composed of aqueous ammonia, pure water and hydrogen peroxide. It should be noted that the unreacted titanium layer 111 is dissolved in the mixture solution, but the titanium nitride layer 110 is not dissolved in the mixture solution. However, the titanium nitride layer 110 can be removed by lift-off accompanied by dissolution of the unreacted titanium layer 111.

Through the above mentioned steps, the C49-structure silicide layer 108 and the first nitrogen containing silicide layer 109 are formed in self-aligning fashion only on the gate electrode 104 and the diffusion layer 106 constituting source/drain regions.

Figure 1E:
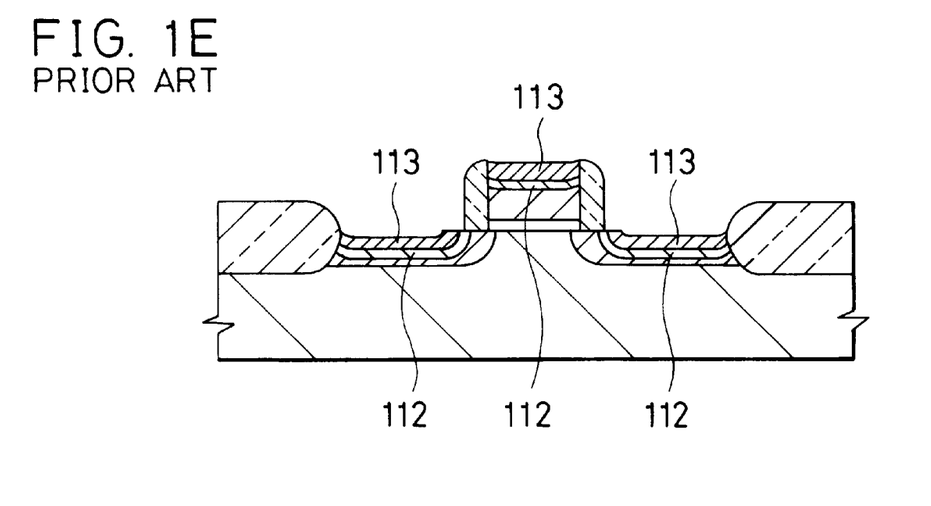

When necessary, a second thermal annealing is carried out for about 60 seconds in $N_2$ atmosphere under atmospheric pressure. Similarly to the first thermal annealing, a lamp annealing apparatus is used, and process temperature is set at about 850° C. As illustrated in FIG. 1E, the second thermal annealing causes the C49-structure silicide layer 108 to change into a C54-structure silicide layer 112 having crystal structure and also having low resistivity. Then, a second nitrogen containing silicide layer or a C54-structure silicide layer 113 containing nitrogen therein is formed over the silicide layer 112.

In the above mentioned prior method of fabricating a salicide configuration, as a silicide layer becomes thinner as the semiconductor device becomes smaller and smaller in size, two problems inherent to thin-film technique arise, which problems appear in particular when a silicide layer is to be formed of a thin titanium film. The two problems are as follows.

First, the titanium silicide layer, namely the above mentioned C49-structure or C54-structure silicide layer is not completely formed because The thermal annealing is carried out by means of the lamp annealing apparatus in which both nitirization process and silicidation process of titanium occur. Because, the nitrization process has greater speed than the silicidation process, if a thinner titanium layer is attempted, the titanium silicide layer will be thinner than attempted. Thus, a silicide layer is not completely formed.

Second, leak current is increased between a gate electrode and source/drain regions because it is difficult to remove a titanium nitride layer on both the spacer and device isolation insulative which are films both composed of a silicon dioxide layer.

Hereinbelow will be explained these problems in detail from a technical viewpoint.

The first mentioned problem is as follows. It is necessary for a silicide layer to be selectively formed only on a gate electrode and a diffusion layer in a salicide configuration. In a conventional method of forming a silicide layer, silicon atoms are diffused in a refractory metal layer such as titanium, thereby silicidation makes progress. When silicidation proceeds on a spacer or a device isolation insulative film both composed of a silicon dioxide layer, silicon atoms contained in a diffusion layer or a polysilicon layer also diffuse into the pacer and the device isolation insulative film, forming a silicide layer where the silicon atoms are diffused (hereinafter, such phenomenon is referred to as overgrowth). Thus, it is not possible to selectively form a silicide layer. In order to avoid the overgrowth from occurring, it is necessary to lower the temperature of the above mentioned thermal annealing.

In such lowered temperature, the nitrization speed of titanium is greater than the silicidation speed of titanium, as having been mentioned earlier. Thus, only the titanium nitride layer and almost no silicide layer is formed on a gate electrode and a diffusion layer.

The secondly mentioned problem is as follows. As mentioned earlier, a titanium nitride layer is formed on a spacer and/or a device isolation insulative film. If a titanium film has a small thickness, the titanium film is entirely changed into a titanium nitride layer by the thermal annealing, and thus no titanium remains film. Thus, it is not possible to completely remove the titanium nitride layer having been formed on a spacer and/or a device isolation insulative film a by lift-off process in which the above mentioned mixture solution is used. Accordingly, an electrical path is formed from residual titanium nitride for current to run between a gate electrode and a diffusion layer, and hence, leak current is increased between a gate electrode and source/drain regions, as mentioned earlier. If etching is carried out sufficiently long to completely remove the titanium nitride layer by using the above mentioned mixture solution, the silicide layer having been formed on a gate electrode and/or a diffusion layer is also removed, resulting in increased electrical resistance.

U.S. Pat. No. 4,855,798 issued to Imamura et al. on Aug. 8, 1989 also discloses a method of fabricating a semiconductor device having a salicide configuration. The method includes the steps of preparing a semiconductor substrate, forming a silicon layer on the substrate, forming a metal layer on the silicon layer, and heating the resultant structure in the presence of a reaction ambient containing nitride for forming a metal silicide layer on the silicon layer and nitriding a surface portion of the metal silicide layer to form a nitride layer consisting of a nitride of the metal silicide.

U.S. Pat. No. 4,545,116 issued to Lau on Oct. 8, 1985 discloses a method of forming a metallic silicide on silicon or polysilicon in which a masking layer, such as silicon dioxide, is formed on a silicon slice and patterned to expose selected areas of the slice surface. The slice is then sputter etched followed by in situ deposition of a metal layer. The slice is heated to convert the portion of the metal layer in contact with the silicon and/or polysilicon to a metal silicide, then the non-converted metal is removed by a selective etchant.

SUMMARY OF THE INVENTION

In view of the problems of the prior method, it is an object of the present invention to provide a method of forming a silicide film on a semiconductor substrate, that facilitates salicidation of a semiconductor device such as a MOS transistor, which is expected to be more micro-sized, and also facilitates ultra-large scale integration, higher densification, and higher operation speed of a semiconductor device.

The invention provides a method of forming a silicide film composed of refractory metal in a certain region of a semiconductor device to be formed on a semiconductor substrate, the method including the steps of (a) depositing a thin film composed of refractory metal on both a semiconductor substrate and a semiconductor device, (b) carrying out a first thermal annealing to the semiconductor substrate, semiconductor device, and refractory metal in depressurized or diluted gas atmosphere including nitrogen therein, and (c) carrying out a second thermal annealing to the semiconductor substrate, semiconductor device and refractory metal in argon gas atmosphere or high vacuum atmosphere.

It is preferable that the second thermal annealing be carried out at higher temperature than the first thermal annealing.

For instance, the depressurized or diluted gas is $NH_3$ gas. When diluted gas is to be used, a preferable diluent is inert gas. The argon gas atmosphere preferably includes nitrogen gas having a pressure equal to or smaller than 100 Torr.

For instance, the refractory metal is titanium, and the depressurized or diluted gas is $N_2$ gas having a pressure equal to or smaller than 1 Torr.

The second thermal annealing is carried out preferably at temperature ranging from 750° C. to 850° C. both inclusive. Preferably, the refractory metal is titanium, and the thin film has a thickness equal to or smaller than 30 nm.

$NH_3$ gas may be used in place of the $N_2$ gas in the first thermal annealing. In such a case, the $NH_3$ gas is arranged to have a smaller partial pressure than that of the $N_2$ gas.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to the drawings.

Figure 2A:
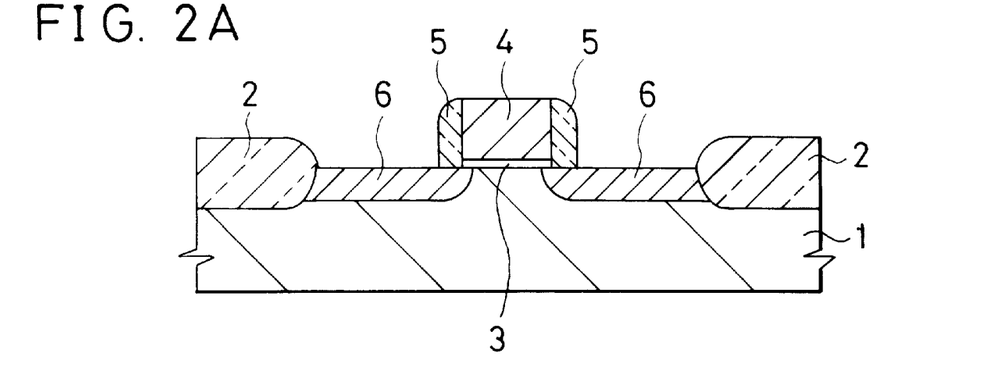
FIGS. 2A to 2E are cross-sectional views showing respective step of a method in accordance with the first embodiment of the present invention.

The first embodiment will be described hereinbelow with reference to FIGS. 2A to 2E. As illustrated in FIG. 2A, a plurality of device isolation insulative films 2 each having a thickness of 300 nm are formed by LOCOS in certain regions on a p-type silicon substrate 1. A silicon substrate in which a p-well is formed may be substituted for the p-type silicon substrate. Then, boron (B) as impurity acting as a channel stopper is ion-implanted, and then a gate insulative film 3 having a thickness of about 8 nm is deposited by thermal oxidation.

Then, a polysilicon film having a thickness of about 100 nm is deposited by CVD over the resultant. Then, impurities such as phosphorus are doped. Then, the polysilicon film is patterned by photolithography and dry-etching into a desired pattern to thereby form a gate electrode 4. Then, a silicon dioxide film having a thickness of about 100 nm is deposited by CVD over the resultant, followed by anisotropic dry etching, thereby forming a spacer 5 at a sidewall of the gate electrode 4.

Then, arsenic (As) as impurity is ion-implanted at a dose of about $1 \times 10^{15}$ cm$^{-2}$, and subsequently, the resultant is thermally annealed at 900° C. to thereby form a diffusion layer 6. Thus, source/drain regions of a MOS transistor are formed.

Figure 2B:
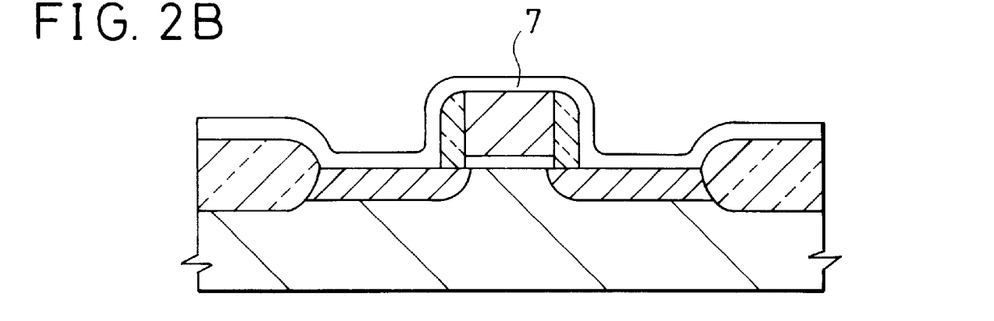

Then, as illustrated in FIG. 2B, a titanium film 7 having a thickness of about 20 nm is deposited over the resultant by titanium sputtering. Then, a first thermal annealing is carried out to a resultant for about 30 seconds in N$_2$ atmosphere under reduced pressure of 10 mTorr. In this first thermal annealing, a lamp annealing apparatus is used, and process temperature is set at about 700° C.

Figure 2C:
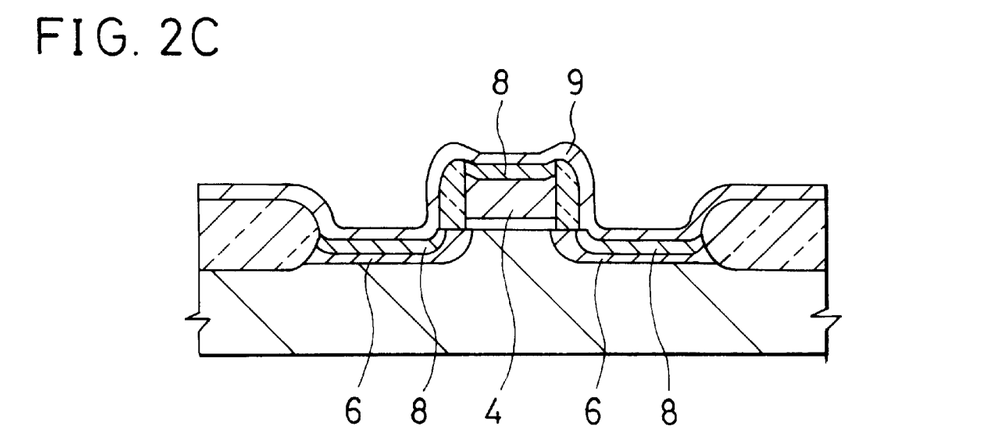

As illustrated in FIG. 2C, by the first thermal annealing, on an exposed surface of the gate electrode 4 and also on a surface of the diffusion layer 6 are formed a C49-structure silicide layer 8 having a crystal structure and high resistivity and, a titanium layer 9 containing nitrogen atoms therein. On the other hand, on the device isolation insulative films 2 and the spacer 5 both composed of a silicon dioxide film are formed only the titanium layer 9 containing nitrogen atoms therein.

The titanium layer 9 contains nitrogen atom in the range of 10 to 20 at % to thereby have a function of suppressing diffusion of silicon atoms. Thus, the earlier mentioned overgrowth of silicide is suppressed. Accordingly, it is possible to set up a first thermal annealing carried out at a higher temperature than the conventional method.

However, a thicker thickness of the titanium film 7 causes the performance of the nitrogen containing suppressive layer 9 of suppressing the overgrowth of silicide to weaken. This is because the thicker titanium layer 7 has no nitrogen atoms in the deeper region at which silicon atoms are thermally diffused. This phenomenon will be described later in detail.

Figure 2D:
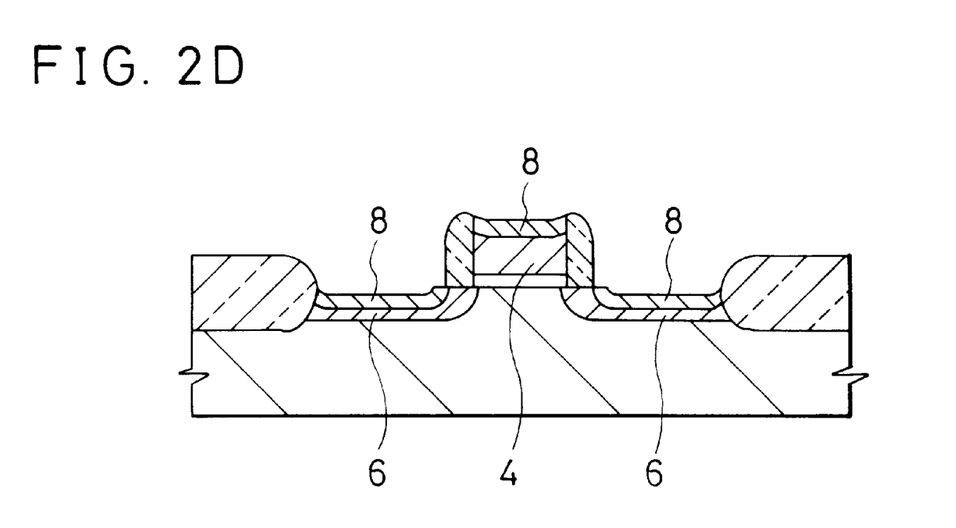

Then, as illustrated in FIG. 2D, the nitrogen containing titanium layer 9 is removed by means of mixture solution composed of aqueous ammonia, pure water, and hydrogen peroxide. It should be noted that since the nitrogen containing titanium layer 9 contains nitrogen atoms, but not stoichiometrically formed unlike titanium nitride, the titanium layer 9 can be dissolved for removal in the mixture solution, similarly to the titanium film 7. Herein, mixture solution composed of sulfuric acid, pure water, and hydrogen peroxide may be used in place of the previously mentioned mixture solution.

Through the above mentioned steps, C49-structure silicide layers 8 are formed in self-aligning fashion only on the gate electrode 4 and the diffusion layers 6 constituting source/drain regions. The C49-structure silicide layers 8 have resistivity of 60 $\mu\Omega$·cm.

Figure 2E:
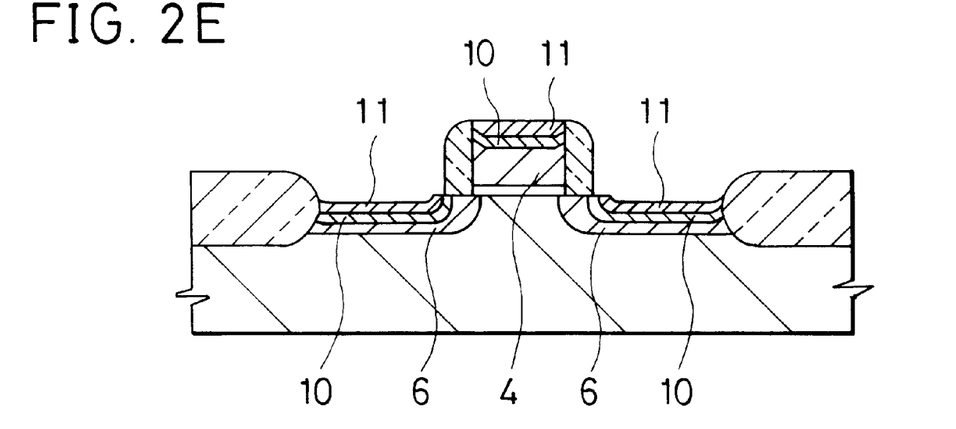

Then, a second thermal annealing is carried out for about 30 seconds in N$_2$ atmosphere under atmospheric pressure. Similarly to the first thermal annealing, a lamp annealing apparatus is used, the process temperature is set at about 800° C. As illustrated in FIG. 2E, the second thermal annealing causes the C49-structure silicide layer 8 to change into a C54-structure silicide layer 10 having a crystal structure and low resistivity. Then, second nitrogen containing silicide layers 11 or C54-structure silicide layers containing nitrogen are formed therein on the C54-structure silicide layers 10. The thus formed C54-structure silicide layers 10 have resistivity of 15 $\mu\Omega$·cm.

Thus, a MOS transistor has silicide layers selectively formed on surfaces of the gate electrode 4 and the diffusion layers 6. In addition, the resistivity of the gate electrode 4 and source/drain regions is decreased.

In the method of forming a salicide configuration in accordance with the present invention, even if a temperature at which the thermal annealing is is set relatively high, a nitrogen atom containing titanium layer is formed, but not a titanium nitride layer. Accordingly, the earlier mentioned problems occurring in the prior method can be resolved.

Figure 3:
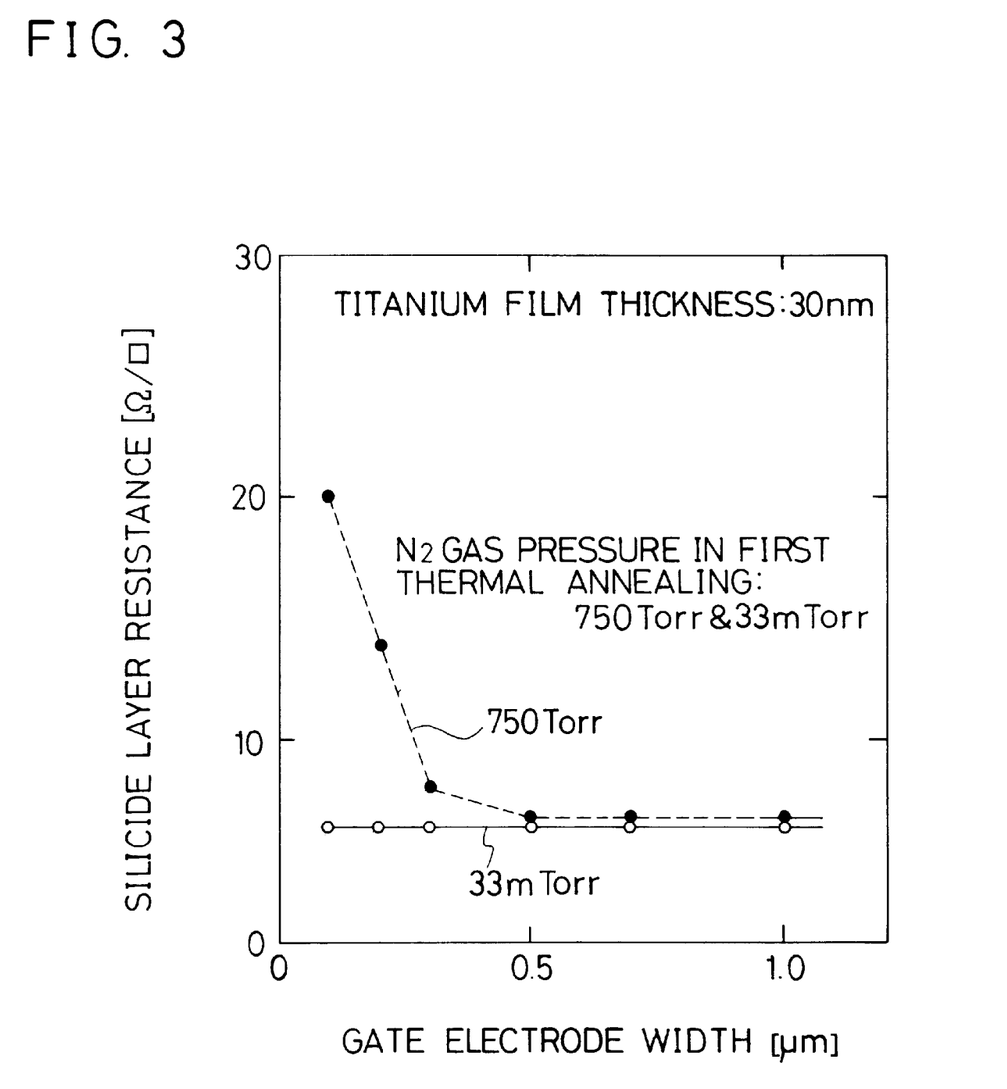
FIG. 3 is a graph showing the relationship between a resistance of a silicide layer and a width of a gate electrode.

In addition, the method in accordance with the present invention gets rid of the dependency of resistance of a silicide layer on a width of silicide such as a gate electrode. Hereinbelow will be explained with reference to FIG. 3 showing the dependency of resistance of a silicide layer on a width of a gate electrode. A titanium layer used for the formation of a silicide layer has a thickness of 30 nm. N$_2$ gas pressure in the first thermal annealing is 33 mTorr. The conditions for salicidation other than those are the same as the first embodiment.

As shown in FIG. 3, in the method in accordance with the present invention, the resistance of a silicide layer remains uniform and is in the range of about 5 to about 6 $\Omega$ per unit area for a width of a gate electrode ranging from 0.1 $\mu$m to 1.0 $\mu$m. On the other hand, in the prior method, the resistance of a silicide layer is drastically increased for a gate electrode width below 0.3 $\mu$m. Thus, the advantageous effects obtained by the present invention become more remarkable for a more micro-sized or larger-scale integrated semiconductor device.

Figure 4:
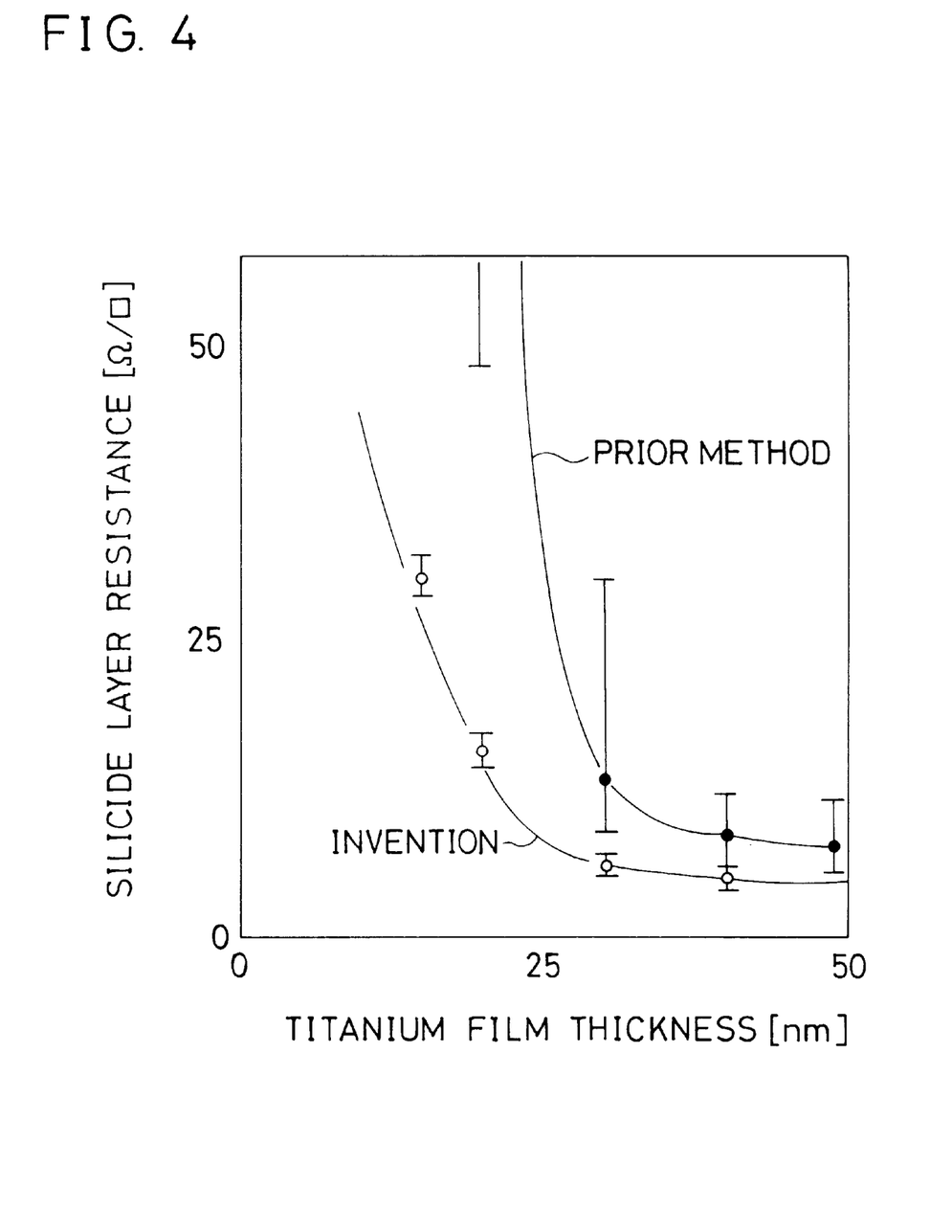
FIG. 4 is a graph showing the relationship between a resistance of a titanium silicide layer and a thickness of a titanium film.

In addition, the advantageous effects obtained by the present invention become marked also for a thinner thickness of a titanium layer used for silicidation. This is explained hereinbelow with reference to FIG. 4 showing the dependency of resistance of a silicide layer on a thickness of a titanium layer. The illustrated resistance of a silicide layer is for a gate electrode having a width of 0.2 $\mu$m. N$_2$ gas pressure in the first thermal annealing is 33 mTorr. The conditions for salicidation other than those are the same as the first embodiment.

As shown in FIG. 4, when the salicidation is carried out by prior method, the resistance of a silicide layer is drastically increased for a titanium layer thickness below 30 nm, whereas the resistance of a silicide layer remains almost the same for a titanium layer thickness over 30 nm. On the other hand, when salicidation is carried out by the present invention, the resistance of a silicide layer remains slightly smaller than that of the prior method for a titanium layer thickness over 40 nm, whereas the resistance is drastically decreased relative to that of the prior method for a titanium layer thickness below 30 nm inclusive. For instance, when a titanium layer thickness is 20 nm, the resistance of a silicide layer in the prior method is about 100 Ω per unit area or greater and has larger dispersion, whereas the resistance of a silicide layer in the present invention is about 15 Ω per unit area, which is smaller than one-sixth of the resistance (100 Ω per unit area) in the prior method, and has a quite smaller dispersion. Thus, the advantageous effects obtained by the present invention become more remarkable for a titanium layer thickness, in particular, below 30 nm inclusive.

Figure 5:
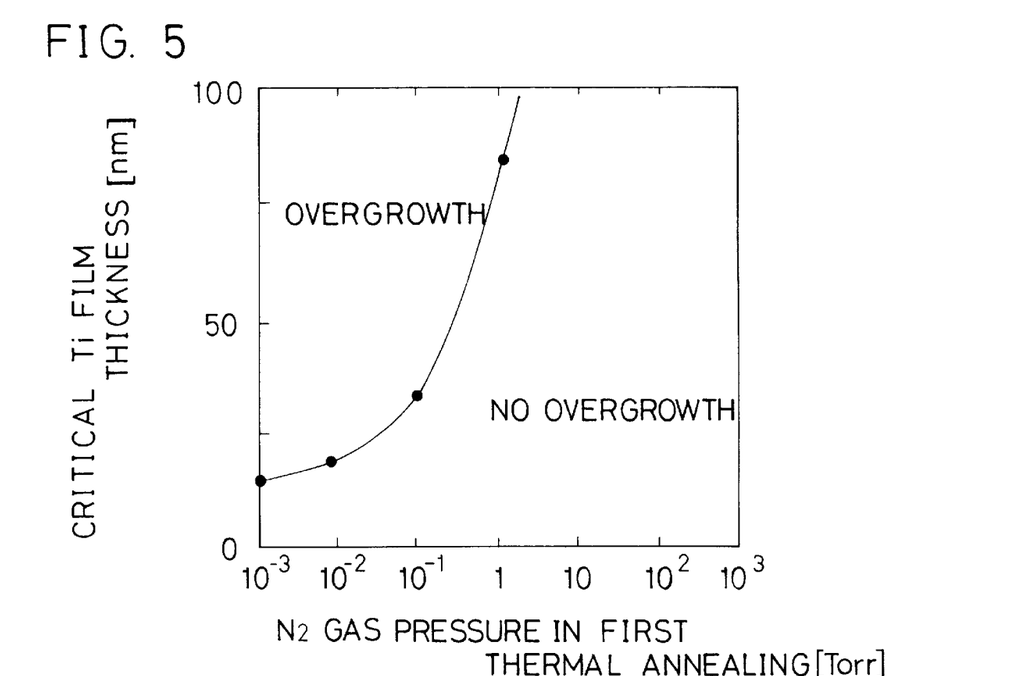
FIG. 5 is a graph showing an upper limit of a titanium film thickness for forming a salicide configuration in accordance with the present invention.

In the salicidation to be carried out in accordance with the present invention, it is necessary for the entire titanium film 7 to be changed into the nitrogen containing titanium layer 9 through the first thermal annealing. This is because electrical leak occurs between a gate electrode and source/drain regions by the overgrowth which would occur if a titanium film is too thick and hence a titanium layer containing no nitrogen atoms remains unremoved, as mentioned earlier. The upper limit of a thickness of a titanium layer from which a nitrogen atoms containing titanium layer can be formed is dependent on the $N_2$ gas pressure in the first thermal annealing. This is explained hereinbelow with reference to FIG. 5 showing the relationship between a critical thickness of a titanium layer at which the overgrowth would not occur and the $N_2$ gas pressure in the first thermal annealing. The conditions for salicidation are the same as the first embodiment. As is obvious from FIG. 5, a critical thickness of a titanium layer is increased as the $N_2$ gas pressure is increased. When the $N_2$ gas pressure is increased beyond 100 mTorr, the critical thickness is increased in proportion to a partial pressure of the gas.

Figure 6:
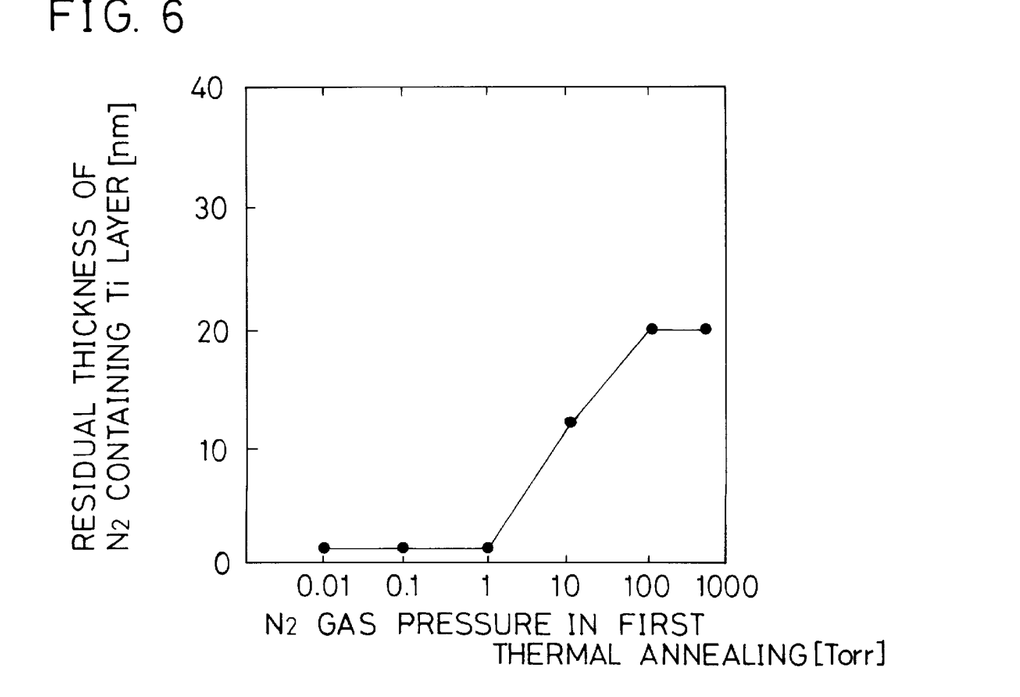
FIG. 6 is a graph showing the relationship between the residual thickness of a titanium film and a pressure of atmosphere gas in the present invention.

As mentioned earlier, the nitrogen containing titanium layer 9 is removed with the mixture solution composed of aqueous ammonia, pure water, and hydrogen peroxide. However, if the titanium layer 9 has a large nitrogen atom content, it is impossible to completely remove the titanium layer 9. This will be explained hereinbelow in detail with reference to FIG. 6 showing the relationship between a residual thickness of a nitrogen containing titanium layer having been etched with the above mentioned mixture solution and the $N_2$ gas pressure in the first thermal annealing. The conditions for salicidation are the same as the first embodiment. As is obvious in view of FIG. 6, when the $N_2$ gas pressure is high, it is difficult to remove the nitrogen containing titanium layer 9. On the other hand, it is possible to completely remove the nitrogen containing titanium layer 9 for the $N_2$ gas pressure below 1 Torr inclusive. Thus, it is obvious that the $N_2$ gas pressure in the first thermal annealing is preferably set below 1 Torr inclusive. An original thickness of the titanium layer 7 does scarcely affect the removal of the nitrogen containing titanium layer 9.

Figure 7A:
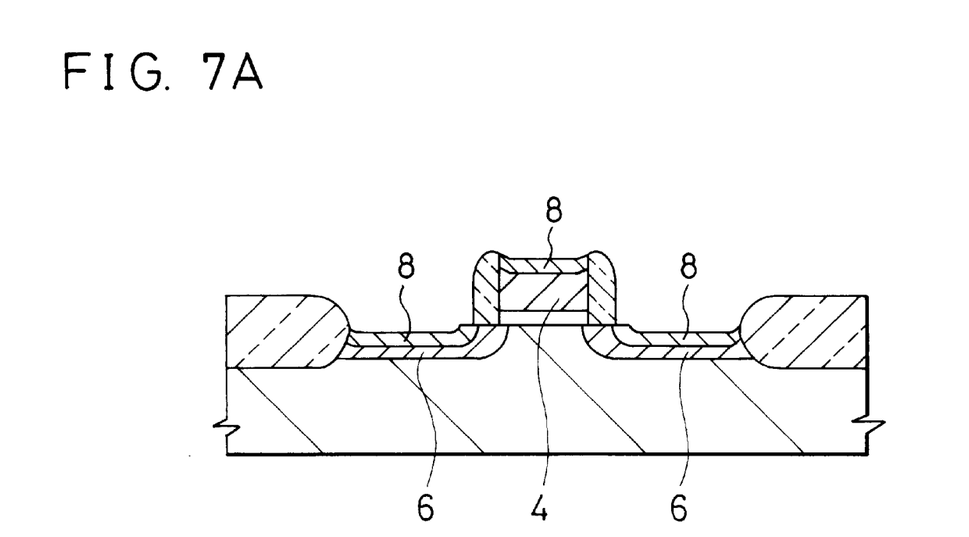
FIGS. 7A and 7B are cross-sectional views showing respective step of a method in accordance with the second embodiment of the present invention.
Figure 7B:
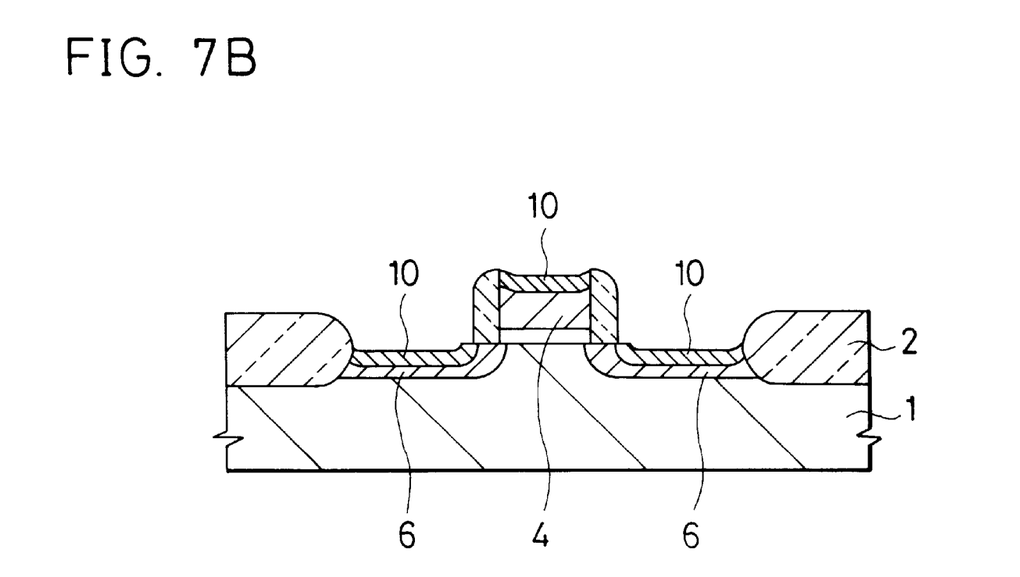

Hereinbelow will be described the second embodiment of the present invention with reference to FIGS. 2A to 2C, 7A and 7B. In the second embodiment, the second thermal annealing is carried out in argon (Ar) gas atmosphere. The second embodiment relates to salicidation of a p-channel MOS transistor. FIGS. 7A and 7B are cross-sectional views illustrating the latter half steps of the salicidation to be carried out in accordance with the second embodiment. Parts or elements corresponding to those of the first embodiment have been provided with the same reference numerals.

As illustrated in FIG. 2A, a plurality of the device isolation insulative films 2 each having a thickness of 400 nm are formed by LOCOS in certain regions on the silicon substrate 1 in which n-wells are formed. Then, the gate insulative film 3 having the thickness of about 8 nm is deposited by thermal oxidation in gas atmosphere including $O_2$ and $N_2O$ gas. The gate insulative film 3 is a silicon dioxide film containing a mass of nitrogen atoms therein.

Then, a polysilicon film having a thickness of about 150 nm is deposited by CVD over a resultant. Then, impurities such as phosphorus are doped. Then, the polysilicon film is patterned by photolithography and dry-etching into a desired pattern to thereby form the gate electrode 4. Then, a silicon dioxide film having the thickness of about 150 nm is deposited by CVD over a resultant, followed by anisotropic dry etching, to form the spacer 5 at a sidewall of the gate electrode 4.

Then, boron (B) as impurity is ion-implanted at a dose of about $5 \times 10^{15}$ cm$^{-2}$, and subsequently, the resultant is thermally annealed at 800° C. to thereby form the diffusion layer 6. Thus, source/drain regions of the p-channel MOS transistor are formed.

Then, as illustrated in FIG. 2B, the titanium film 7 having a thickness of about 30 nm is deposited over a resultant by titanium sputtering.

Then, the first thermal annealing is carried out to a resultant for about 30 seconds in $N_2$ atmosphere under reduced pressure of 33 mTorr. In this first thermal annealing, a lamp annealing apparatus is used, and process temperature is set at about 700° C.

As illustrated in FIG. 2C, by the first thermal annealing, on an exposed surface of the gate electrode 4 and also on a surface of the diffusion layer 6 are formed the C49-structure silicide layer 8 having a crystal structure and high resistivity the and the titanium layer 9 containing nitrogen atoms therein. On the other hand, on the device isolation insulative films 2 and the spacer 5 both composed of a silicon dioxide film are formed only the nitrogen atoms containing titanium layer 9. The titanium layer 9 contains nitrogen atoms at 15 at %.

Then, as illustrated in FIG. 7A, the nitrogen containing titanium layer 9 is removed by means of mixture solution composed of aqueous ammonia, pure water and hydrogen peroxide.

Through the above mentioned steps, the C49-structure silicide layers 8 are formed in self-aligning fashion only on the gate electrode 4 and the diffusion layers 6 constituting source/drain regions. The C49-structure silicide layers 8 have resistivity of 60 $\mu\Omega$·cm.

Then, the second thermal annealing is carried out for about 60 seconds in Ar atmosphere under atmospheric pressure. Similarly to the first thermal annealing, a lamp annealing apparatus is used, and the process temperature is set at about 750° C. As illustrated in FIG. 7B, the second thermal annealing causes the C49-structure silicide layer 8 to change into the C54-structure silicide layer 10 having a crystal structure and low resistivity. The thus formed C54-structure silicide layers 10 have a resistivity of 15 $\mu\Omega$·cm.

Thus, a salicided MOS transistor is formed on the silicon substrate 1.

A silicide layer formed in the second embodiment has a smaller resistance than a silicide layer formed in the first embodiment. This is because the second thermal annealing prevents the formation of the second nitrogen containing silicide layer 11 as formed in the first embodiment on the C54-structure silicide layer 10, and hence the C54-structure silicide layer 10 can be effectively thicker.

Figure 8:
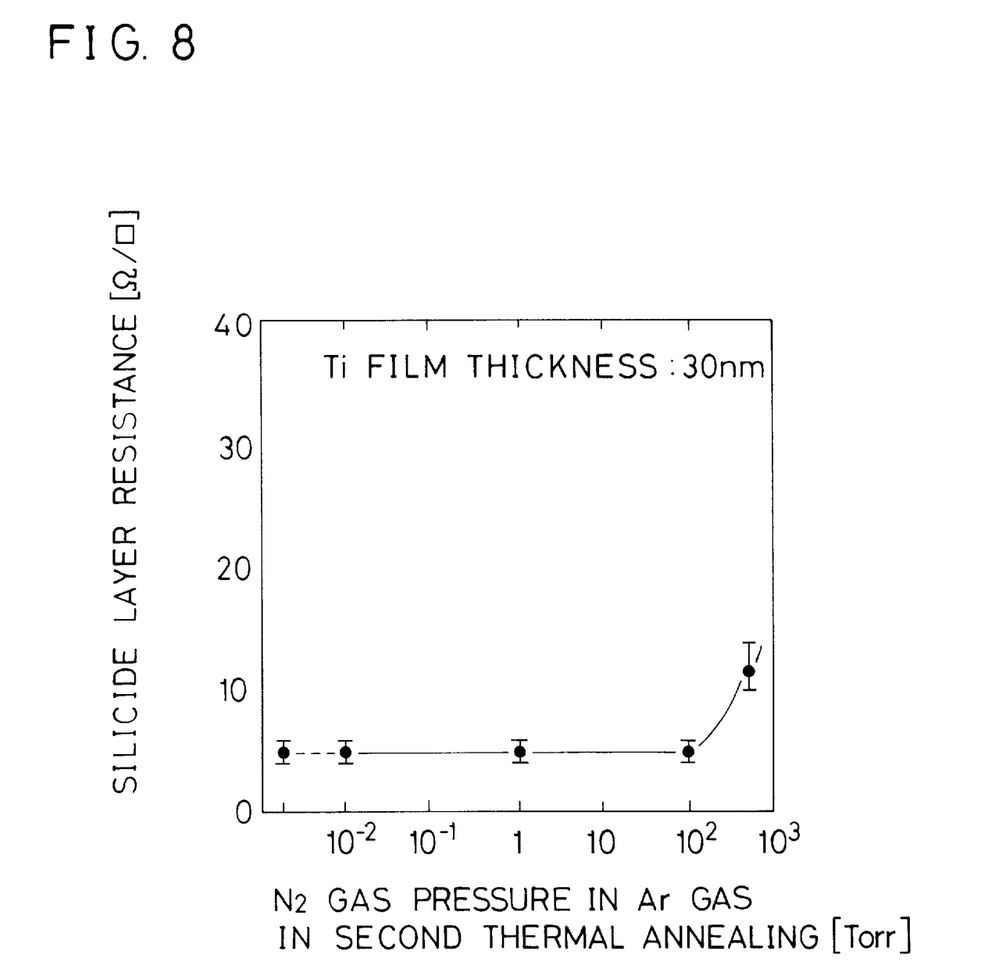
FIG. 8 is a graph showing the relationship between a resistance of a silicide layer and atmosphere gas of the second thermal annealing.

This is explained in detail with reference to FIG. 8 showing the relationship between a resistance of a silicide layer formed in the second embodiment and atmosphere gas pressure in the second thermal annealing. The resistance of a silicide layer is for a gate electrode having a width of 0.2 $\mu$m. The atmosphere gas includes depressurized $N_2$ gas as well as the argon gas. As is clear in FIG. 8, a resistance of a silicide layer is in the range of 3 to 4 $\Omega$ per unit area, which is smaller than the resistance of 5 to 6 $\Omega$ per unit area shown in FIG. 5. In addition, it is found that the resistance of a silicide layer remains low by using the atmosphere gas containing nitrogen gas having a pressure below 100 Torr in the second thermal annealing. This is because that the second thermal annealing temperature is relatively low, and that the low pressure gas would not contribute to the formation of the second nitrogen containing silicide layer 11.

In addition, the second thermal annealing in the second embodiment is carried out at a lower temperature than the first embodiment. This is considered because nitrogen atoms do not enter the C49-structure silicide layer, which is phase-changed into the C54-structure silicide layer in the second thermal annealing. Thus, the C49-structure silicide layer can be readily changed into the C54-structure silicide layer.

Figure 9:
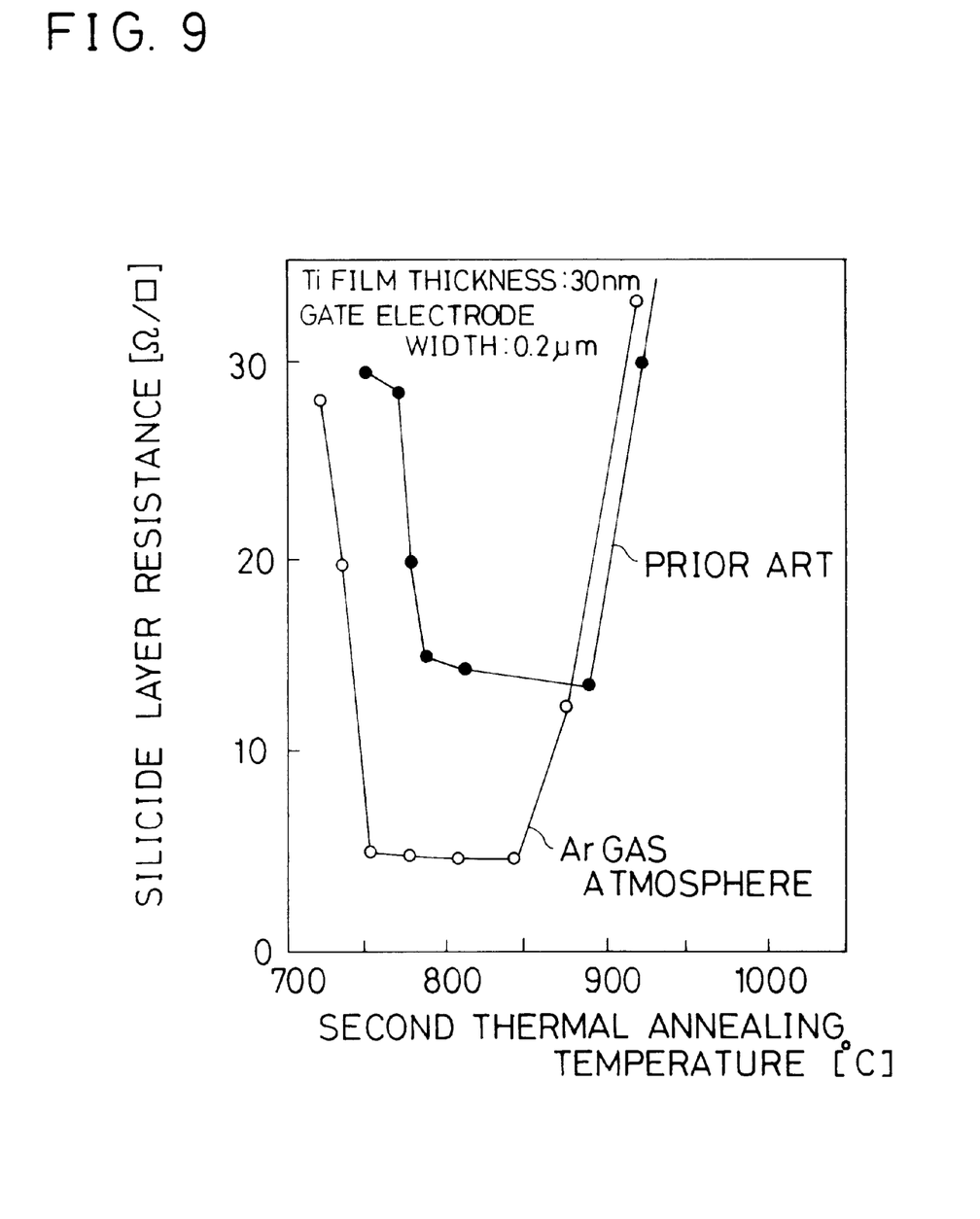
FIG. 9 is a graph showing the relationship between the resistance of a silicide layer and temperature at which the second thermal annealing is to be carried out.

This is explained in detail with reference to FIG. 9 which is a graph showing the relationship between a resistance of a silicide layer and the thermal annealing temperature in a case where the second thermal annealing temperature varies in the second embodiment. For comparison, there is also shown the similar relationship obtained when a silicide layer is to be carried out in accordance with the prior method. The resistance of a silicide layer is for a gate electrode having a width of 0.2 $\mu$m. As is understood in view of FIG. 9, the temperature at which the C49-structure silicide layer is shift-changed into the C54-structure silicide layer is about 50° C. lower than the prior method. In the present invention, the shift-changed C54-structure silicide layer has a lowest resistance when the second thermal annealing temperature is in the range of 750 to 850° C.

The C54-structure silicide layer coheres, if thermally annealed at a higher temperature. The cohered C54-structure silicide layer has a degraded thickness uniformity. In the worst case, the C54-structure silicide layer becomes island-shaped and isolated from surroundings, resulting in that the resistance of the silicide layer is drastically increased, as shown in FIG. 9.

It is possible in the second embodiment to suppress the nitrogen content of the silicide layer from being increased and change the silicide layer into a low-resistance phase by suppressing the diffusion of nitrogen atoms into the silicide layer in the second thermal annealing. Thus, dispersion in resistance of a thin silicide layer can be lowered. This means that the same advantageous effects can be obtained even if the second thermal annealing is carried out in high vacuum condition.

In the second embodiment, boron impurities may be doped into a polysilicon film of which a gate electrode is formed. In such a case, a silicide layer becomes thicker than a polysilicon film into which phosphorus impurities are doped. Thus, a resistance of a silicide layer is further decreased. A resistance of a silicide layer is further decreased when a polysilicon film and/or a diffusion layer contain boron impurities than when a polysilicon film and/or a diffusion layer contain arsenic or phosphorus impurities. However, the present invention provides the same advantageous effects even when boron impurities are doped into a polysilicon film and/or a diffusion layer.

In the above mentioned first and second embodiments, the depressurized $N_2$ gas is used as atmosphere gas in the first or second thermal annealing. However, it should be noted that the same effects can be obtained, even if $N_2$ gas diluted with inert gas such as Ar, He and Ne to have a small partial pressure is to be used in place of the depressurized $N_2$ gas. It also should be noted that $NH_3$ gas substituted for the $N_2$ gas provides the same advantageous effects. However, the $NH_3$ gas has to have a smaller partial pressure than that of the $N_2$ gas.

Titanium is used as refractory metal in the above mentioned embodiments. It should be noted that other metals such as tungsten and tantalum may be used as refractory metal for salicidation. When tungsten or tantalum is to be used, $NH_3$ or $N_2H_2$ gas has to be used as thermal annealing atmosphere gas for salicidation. The conditions for salicidation other than the atmosphere gas are the same as those of the first or second embodiment.

As having been described in connection with the preferred embodiments, a partial pressure of $N_2$ gas to be used as thermal annealing atmosphere gas is set below atmospheric pressure at least in the first thermal annealing among two thermal annealings to be carried out for salicidation. In the method of the present invention, nitrization of refractory metal to be used for salicidation or silicide can be suppressed, and in addition, diffusion of nitrogen atoms into the refractory metal or silicide is controlled.

Thus, the nitrogen content of a silicide layer is decreased to thereby accomplish the reduction in a resistance of the silicide layer. In addition, a silicide layer is selectively formed only on a gate electrode and a diffusion layer. Accordingly, it is possible to completely prevent current leaks between a gate electrode and source/drain regions in a MOS transistor, which would occur in the prior art.

In addition, it is also possible to significantly reduce the dispersion in resistance of a silicide layer, which would occur due to reduction in a width of a gate electrode or shallower junction depth of a diffusion layer. Thus, the method of the present invention facilitates salicidation of a semiconductor device such as a MOS transistor that is expected to be more micro-sized, and also facilitates ultra-large scale integration, higher densification, and higher operation speed of a semiconductor device.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A method of forming a silicide film composed of refractory metal in a certain region of a semiconductor device on a semiconductor substrate, said method comprising:

depositing a film composed of said refractory metal on both said semiconductor substrate and said semiconductor device;

carrying out a first thermal annealing to said semiconductor substrate, said semiconductor device, and said refractory metal in a depressurized or diluted gas atmosphere containing nitrogen, the nitrogen containing atmosphere having a partial pressure smaller than an ambient atmospheric pressure to suppress nitrization of the refractory metal and reduce the number of nitrogen atoms to be diffused into the refractory metal; and carrying out a second thermal annealing to said semiconductor substrate, said semiconductor device, and said refractory metal in an argon gas atmosphere or vacuum atmosphere.

2. The method as set forth in claim 1, wherein said depressurized or diluted gas atmosphere includes $NH_3$ gas.

3. The method as set forth in claim 1, wherein said argon gas atmosphere includes nitrogen gas having a pressure equal to or less than 100 mTorr.

4. The method as set forth in claim 1, wherein said diluted gas atmosphere includes a diluted inert gas.

5. The method as set forth in claim 1, wherein said refractory metal is titanium, and said depressurized or diluted gas atmosphere includes $N_2$ gas having a pressure equal to 33 mTorr.

6. The method as set forth in claim 1, wherein said second thermal annealing is carried out at temperature ranging from 750° C. to 850° C. both inclusive.

7. The method as set forth in claim 1, wherein said refractory metal is titanium, and said film has a thickness of 30 nm or less.

8. The method as set forth in claim 1, wherein said semiconductor device is an insulative gate field effect transistor, and a silicide layer is selectively formed on a gate electrode and source/drain regions of said transistor by said first thermal annealing.

9. The method as set forth in claim 1, wherein the nitrogen is form $NH_3$ gas.

10. The method as set forth in claim 9, wherein said $NH_3$ gas ha a lower partial pressure than that of nitrogen gas.

11. A method of forming a silicide film composed of refractory metal in a certain region of a semiconductor device on a semiconductor substrate, said method comprising;

depositing a film composed of said refractory metal on both said semiconductor substrate and said semiconductor device;

carrying out a first thermal annealing to said semiconductor substrate, said semiconductor device, and said refractory metal in a depressurized or diluted gas atmosphere containing nitrogen, the nitrogen gas containing atmosphere having a partial pressure smaller than an ambient atmospheric pressure to suppress nitrization of the refractory metal and reduce the number of nitrogen atoms to be diffused into the refractory metal; and carrying out a second thermal annealing to said semiconductor substrate, said semiconductor device, and said refractory metal in an argon gas atmosphere or vacuum atmosphere at a higher temperature than said first thermal annealing.

12. The method as set forth in claim 11, wherein said depressurized or diluted gas atmosphere includes $NH_3$ gas.

13. The method as set forth in claim 11, wherein said argon gas atmosphere includes nitrogen gas having a pressure equal to or less than 100 mTorr.

14. The method as set forth in claim 11, wherein said diluted gas atmosphere includes a diluted inert gas.

15. The method as set forth in claim 11, wherein said refractory metal is titanium, and said depressurized or diluted gas atmosphere includes $N_2$ gas having a pressure equal to 33 mTorr.

16. The method as set forth in claim 11, wherein said second thermal annealing is carried out at temperature ranging from 750° C. to 850° C. both inclusive.

17. The method as set forth in claim 11, wherein said refractory metal is titanium, and said film has a thickness of 30 nm or less.

18. The method as set forth in claim 11, wherein said semiconductor device is an insulative gate field effect transistor, and a silicide layer is selectively formed on a gate electrode and source/drain regions of said transistor by said first thermal annealing.

19. The method as set forth in claim 11, wherein the nitrogen is from $NH_3$ gas.

20. The method as set forth in claim 19, wherein said $NH_3$ gas has a lower partial pressure than that of nitrogen gas.

21. A method of forming a silicide film composed of refractory metal in a certain region of a semiconductor device on a semiconductor substrate, the method comprising:

depositing a film having a thickness equal to or smaller than 30 nm and composed of the refractory metal on both the semiconductor substrate and the semiconductor device;

thermally annealing the semiconductor substrate, the semiconductor device, and the refractory metal in a gas containing nitrogen, in a partial pressure smaller than an ambient atmospheric pressure to suppress nitrization of the refractory metal and reduce the number of nitrogen atoms to be diffused into the refractory metal; and thermally annealing the semiconductor substrate, the semiconductor device, and the refractory metal in an argon or vacuum atmosphere.

* * * * *